(12) United States Patent
Esker

(10) Patent No.: US 6,236,277 B1
(45) Date of Patent: May 22, 2001

(54) LOW DEVIATION SYNCHRONIZATION CLOCK

(75) Inventor: Lawrence W. Esker, Concord, OH (US)

(73) Assignee: Rockwell Technologies, LLC, Thousand Oaks, CA (US)

( * ) Notice: Subject to any disclaimer, the term of this patent is extended or adjusted under 35 U.S.C. 154(b) by 0 days.

(21) Appl. No.: 09/409,959

(22) Filed: Sep. 30, 1999

(51) Int. Cl.[7] .................................. H03L 7/00; H04L 7/08
(52) U.S. Cl. ........................ 331/14; 331/17; 331/25; 331/34; 375/356; 700/3
(58) Field of Search .................................. 331/14, 17, 25, 331/34; 375/356; 700/2, 3

(56) References Cited

U.S. PATENT DOCUMENTS

| | | | |
|---|---|---|---|
| 5,519,726 | * | 5/1996 | DiCarlo ................................ 375/224 |
| 5,661,700 | * | 8/1997 | Weppler ................................ 368/46 |
| 5,887,029 | * | 3/1999 | Husted et al. ........................ 375/224 |

* cited by examiner

Primary Examiner—Siegfried H. Grimm
(74) Attorney, Agent, or Firm—John J. Horn; John M. Miller

(57) ABSTRACT

A local clock used for synchronizing events in an industrial control system may be synchronized with a master clock according to synchronization signals received at a first period. Updating of the local clock is performed on a more frequent basis than the receipt of the update signals. By using the update signals to derive an error value which is incrementally applied to the clock at a much higher rate, the maximum deviation is reduced. The system works with clocks having discrete frequency outputs by adjusting the update rate so as to effectively produce a continuously variable output frequency for the local clock over an interval equal to the update rate.

8 Claims, 2 Drawing Sheets

LOW DEVIATION SYNCHRONIZATION CLOCK

CROSS-REFERENCE TO RELATED APPLICATIONS

STATEMENT REGARDING FEDERALLY SPONSORED RESEARCH OR DEVELOPMENT

BACKGROUND OF THE INVENTION

The present invention relates to industrial controllers for the real time control of industrial processes and in particular to a clock circuit that permits precise coordination of actions among different industrial controllers.

Industrial controllers are special purpose computers used for controlling industrial processes and manufacturing equipment. Under the direction of a stored program, the industrial controller examines a series of inputs reflecting the status of the controlled process and changes a series of outputs to control the industrial process. The inputs and outputs may be binary, that is on or off, or analog providing a value within a continuous range of values.

An industrial controller differs from a conventional computer in that the various components of the industrial controller may be separated by a considerable distance commensurate with the expanse of a large factory or manufacturing operation. The separated industrial controllers communicate via digital messages transmitted over one or more communication links.

These links necessarily introduce a delay in the communication between controllers depending on the distance between controllers and the amount of message traffic. In order to reduce this delay, time critical messages may be assigned a high priority on the link, where high priority messages obtain use of the shared communication media in preference to low priority messages. Normally, however, the proportion of the message carrying capacity of the communication link allocated to high priority messages is limited to ensure that low priority messages will also be ensured reliable transmission. As a result, a typical message between controllers will experience a significant and often unpredictable delay.

It is known to moderate the effects of this delay by providing each controller with an accurate clock to which control activities may be synchronized across the entire network of controllers. For example, a control event may be linked with a time of execution and transmitted in a control message to the various controllers before the time the control event must be performed. The actual execution of the control event is then triggered by the clock of each controller without concern about the time or receipt of the control message. Likewise, data being accepted by a given controller may be "time stamped" with the value of the controller's clock so that the data's precise time of arrival may be determined by another controller, even though the message transmitted to the other controller may be delayed.

For this approach to be successful, the clock used by a controller must be synchronized precisely with the clocks of the other controllers. This can be done by transmitting among all controllers a time synchronization signal. The signal may be transmitted with very high priority so as to the extent practical to cause each industrial controller to receive the synchronization signal at the same time so that it may update the value on its clock.

The time synchronization signal is transmitted only occasionally and the clocks allowed to run free between such update times so that transmission of the synchronization signal does not usurp the entire bandwidth of the communication link devoted to high priority signals.

U.S. Pat. No. 5,661,700 assigned to the assignee of the present invention and hereby incorporated by reference recognized that the periodic updating of a local clock of a controller can be disruptive if the clock has drifted sufficiently between updating times so that the process of the updating causes some time values to be skipped. An instruction intended to be executed at one of the skipped times value would in this case never be executed. Accordingly, the above patent teaches an updating process using two clocks, the first clock which is updated abruptly at the update time, and the second clock which is gradually adjusted during the interval between update times to reduce the error between itself and the first clock. Under this system no time values are skipped.

With increasing demands for high accuracy industrial control, the deviation of clocks that are allowed to free-run is no longer acceptable. Nevertheless, the alternative of providing more frequent update periods is undesirable because of the burden it places on the communication links.

BRIEF SUMMARY OF THE INVENTION

The present invention reduces the deviation of the local clocks between update times without increasing the frequency of the update times or the precision of the free running local clock. At the update time, an error is determined, but rather than applying the error to the local clock in the form of a single correction, the correction is broken into portions applied at regular intervals between update times. By breaking the correction process into portions, no time values are skipped and the maximum deviation of the clock between update times is significantly reduced.

In practice, the corrections are implemented by a controllable digital divider on the output of the oscillator that is switched between two divisors that on average correct the clock frequency to be obtained. The frequency of the switching between the divisors, each of which produces a single discrete clock frequency, allows an effective continuous range of frequency adjustment of the local clock.

Specifically then, the present invention provides a local clock for an industrial controller that is synchronizable to a remote master clock. The local clock includes an oscillator providing a set of discrete frequencies and a counter communicating with the oscillator to produce a first-time value. An input of the local clock periodically receives an error signal at a first rate, the error signal indicating the deviation of the first-time value from a second-time value of the master clock. A correction circuit responds to the error signal to switch the oscillator between two of the discrete frequencies at a second rate greater than the first rate so as to reduce the maximum deviation between the first time value and the second-time value.

Thus, it is one object of the invention to limit the maximum deviation between two free running clocks that are updated only at a first rate. Although the updating at the first rate limits the long term deviation of the clocks, the correction circuit by also updating at a second rate faster than the first rate, limits short term deviation of the clocks.

The oscillator may be a constant frequency time base providing an output to a divide-by-N digital counter also receiving a divisor input from the correction circuit. Change among the set of discrete frequencies is provided by changing the divisor.

Thus, it is another object of the invention to provide for a precise synchronization of two clocks in a digital system which provides only discrete frequency increments. The updating process provided by the correction circuit, which switches at a variable rate between two discrete frequencies, provides a nearly continuous range in average frequencies so that the master clock and local clock may be precisely coordinated.

The correction circuit may be an accumulator adding periodically at the second rate, an addend related to the error signal, the accumulator providing an overflow and underflow output communicating with the oscillator to switch the oscillator between the two discrete frequencies at the second rate determined by the rate of overflow and underflow.

Thus, it is another object of the invention to provide a simple mechanism for changing the rate of updating in proportion to the amount of error. Greater error signals provide greater rates of overflow or underflow in the accumulator.

The error signal may be a measure of frequency deviation between the oscillator of the local clock and the oscillator of the master clock, or a measure of time deviation between the first value of the local clock and the second value of the master clock, or a measure of frequency drift as a function of time between the oscillator of the local clock and the oscillator of the master clock.

Thus, it is another object of the invention to provide a system that may flexibly accommodate may different measures of error between the clocks and thus may accommodate different closed-loop strategies for synchronizing clocks. The addend to the accumulator may be a simple function of any of these errors or their combination.

The foregoing and other objects and advantages of the invention will appear from the following description. In the description, reference is made to the accompanying drawings which form a part hereof and in which there is shown by way of illustration a preferred embodiment of the invention. Such embodiment does not necessarily represent the full scope of the invention, however, and reference must be made to the claims herein for interpreting the scope of the invention.

BRIEF DESCRIPTION OF THE DRAWINGS

FIG. 1 is a perspective view of an industrial control system having spatially separated controllers having local clocks that must be synchronized;

FIG. 2 is a block diagram of one industrial controller of FIG. 1 showing the processor for executing a control program and a portion of the synchronization system of the present invention, and a clock circuit providing a synchronizable local clock;

FIG. 3 is a detailed block diagram of the clock circuit of FIG. 2 showing an oscillator having an output divider adjustable by signals from an accumulator which receives an addend based on an error value;

DETAILED DESCRIPTION OF THE INVENTION

Figures 1, 2, 3:
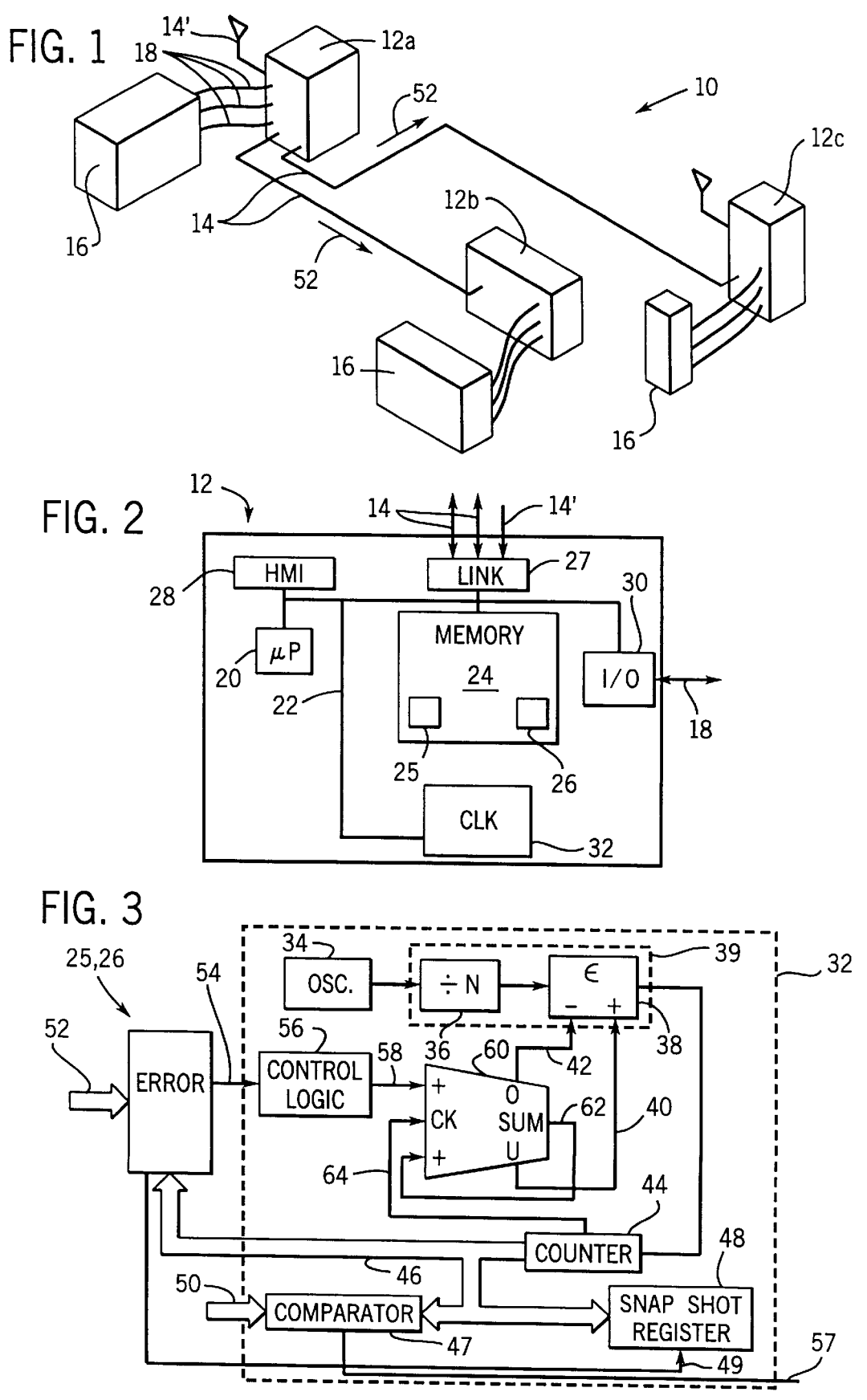
Figure 4:
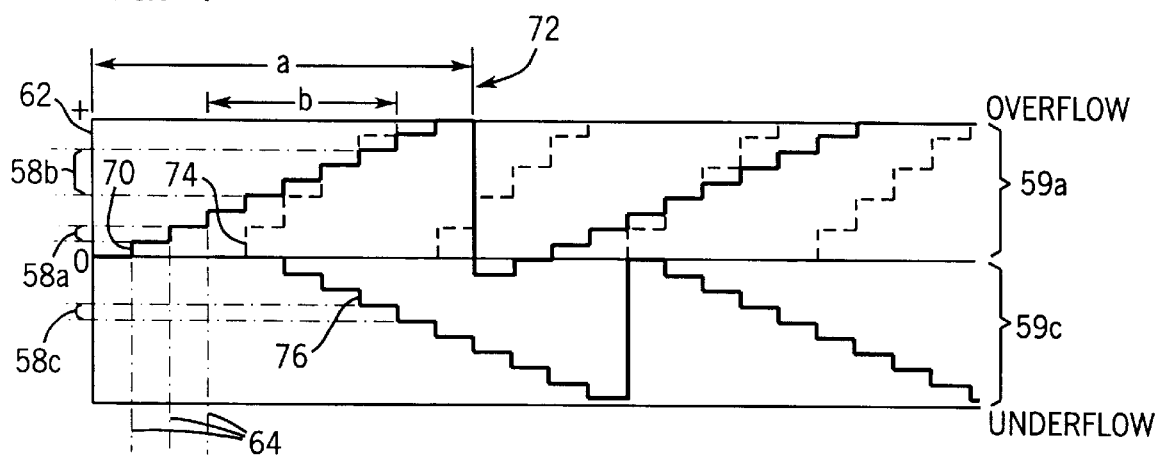
FIG. 4 is a graph of accumulator output versus time for different error values showing different overflow rates such as trigger corrections to the oscillator of FIG. 3.

Referring now to FIG. 1, an industrial controller 10 suitable for use with the present invention provides a number of separate controllers 12a–12c interconnected by one or more communication links 14. The controllers 12a–12c communicate with controlled equipment 16 via input/output (I/O) modules communicating with I/O lines 18 to effect the control of equipment 16. Alternatively, and as is more typical with current controllers 12, the I/O 30 may be in separate units (not shown) communicating with the controllers 12 also via the network 14. Generally, the links 14 are optical or electrical cabling as is known in the art, but links 14 may also include a receiving antenna 14' for a global positioning signal (GPS) or the like. Referring now to FIG. 2, each controller 12a–12c includes a processor 20 communicating over an internal bus 22 with electronic memory 24. Memory 24 may hold a stored control program 25 for executing instructions providing for control of the equipment 16 as is well understood in the art. Memory 24 may also include an operating program 26 providing instructions for implementation of the present invention in the context of the multiple connected controllers 12a–12c as will be described below. In the case where the I/O 30 is separate from the controller 12, the controller 12 appears as is depicted in FIG. 2 without the I/O 30 and the I/O lines 18, and the separate I/O 30 is realized by a unit identical to the controller 12 as shown in FIG. 2 without the HMI 28.

Where the I/O 30 is separate from the controller 12, the I/O 30 may independently make use of the below described time synchronization of the present invention.

The bus 22 also connects to a link circuit 27 providing the protocols necessary for communication between controllers 12 on the links 14 such as Ether Net, Control Net, Field Bus, Fire Wire, GPS and other protocols well known in the art. A human machine interface (HMI) 28 may also connect to the bus 22 to provide for local control by operators of the equipment 16. I/O circuits 30 connecting to the bus 22 provide for the interface of the controller 12 to the equipment 16 through I/O lines 18 as have been described. Finally, the bus 22 connects to a clock circuit 32 of the present invention which provides a local time base for execution of instructions of the control program 25 and the like, according to techniques known in the art.

Generally, the clock circuit 32 provides a local time value which must be synchronized to a master time value generated remotely by one of the controllers 12a–12c, and received over link 14 or by an external device such as a GPS satellite and received over link 14'.

Synchronization of the local clocks of the controllers 12a–12c is performed by transmitting by one controller 12a designated as a master, to each of the other controllers 12b and 12c a synchronizing message 52 consisting of a timing pulse followed asynchronously by a time value message indicating a master time value associated with the previous timing pulse. The timing pulse may be very short and either an intrinsic part of the communication protocol or easily transmitted as a high priority message with little utilization of network bandwidth. The master time value on the other hand, which is necessarily longer, may be transmitted by a less scheduled or lower priority method. The timing pulse may be derived from a GPS signal and a master time value may be appended to this timing pulse by controller 12a acting in the capacity of a master clock.

Generally, each controller 12b and 12c not acting as the master clock receives the synchronizing message 52 and marks the receipt time against its local clock. It then compares the receipt time of the synchronizing message 52 recorded by its local clock against the master time value transmitted as part of the synchronizing message 52 to determine an error between its local clock and the master time. This error is used to correct the clock circuit 32.

Referring now to FIG. 3, the clock circuit 32 which provides the local clock value, receives the error signal 54 after processing of the synchronizing message 52 by other parts of the controller 12, specifically, as will be described by the operating program 26 executing on the processor 20. The clock circuit 32 includes a local oscillator 34 being, for example, a crystal oscillator, providing a nominally constant and stable square wave output of known frequency. The output of the clock circuit 32 is received by a divide-by-N counter 39 which divides the frequency by a variable N value. The divide-by-N counter 39 includes a pre-scaler 36 and pulse modification circuitry 38. The pre-scaler 36 divides the frequency from the oscillator 34 by a constant amount N allowing use of a more compact crystal for oscillator 34 producing a frequency higher than that desired by the controller 12. The pre-scaler also provides for an effectively finer divisor adjustment by the divide-by-N counter 39 as will be described. Pre-scaler 36 may be a binary counter well understood in the art.

The output of the pre-scaler 36 received by pulse modification circuitry 38, provides a temporary, small effective modification of the divisor N. The pulse modification circuitry 38 adds a digital pulse between pulses of the waveform output by the pre-scaler 36 or suppresses one pulse of the waveform output by the pre-scaler 36, according to a signal received on the add pulse line 40, or subtract pulse line 42.

Thus, the output of the divide-by-N counter 39 therefore has a frequency that is effectively adjusted to equal the input frequency divided amount N, N+$\epsilon$, or N-$\epsilon$ according to the insertion or subtraction of pulses where $\epsilon$ may be an extremely small amount in proportion to the value of N depending on how frequently pulses are added or subtracted. During most of the operation of the divide-by-N counter 39, no pulses are added nor subtracted so that the effective divisor is N.

The output of the divide-by-N counter 39 is received by local time counter 44, being simply a binary counter, which provides a local time 46 that may be used by the controller 12 in synchronizing its control activities. The local time 46 is also received by a snapshot register 48 which may be triggered by the controller 12, for example, for recording the local time at the arrival of the synchronizing pulse of synchronizing message 52, or for other purposes necessary in the control of the equipment 16. The snapshot register is triggered by trigger line 49.

The local time 46 is also received by one or more comparators 47 which may receive a second time value 50, for example from a control event message, and provide a signal 57 when the value of the local time 46 is the same as the value 50 so as to trigger a control action described by the control event message.

Referring still to FIG. 3, as has been previously described, the operating program 26, as implemented by the processor 20 and memory 24, receives via a link 14, a time synchronization pulse and master time value together forming a synchronizing message 52. The operating program 26 triggers the snapshot register 48 through line 49 to record the local time from counter 44 at the occurrence of the pulse of the synchronizing message 52. The local time may then be compared to the message portion of the synchronizing message 52 to produce an error signal 54 reflecting the difference between a remote master clock producing the synchronizing message 52 and the local clock represented by local time 46.

Alternatively, the error signal 54 may be deduced from historical comparisons between synchronizing message 52 and local counter 44 used to deduce a variation between the frequencies of the oscillator underlying the master clock, and the local oscillator 34. This provides an error signal 54 proportional to a deviation in frequency between these oscillators. Alternatively, the error signal 54 may represent a change in frequency over time deduced from yet more extensive historical records of frequencies deduced at different update times.

The error signal 54 is received by control logic 56 which produces an addend value 58. The addend value 58 may simply be a proportion function of the error signal 54, or a combination of the several types of error signals 54, or other function as would be understood in the art to provide necessary closed-loop gain for stable operation of the correction process to be described.

The control logic 56 may be implemented simply by a lookup table or a gate-array or similar techniques known in the art or may be implemented by the processor 20 as part of the execution of the program 25.

The addend 58 is received by an accumulator 60 which upon the occurrence of a clock signal 64, sums the addend 58 with a previously accumulated output 62 of the accumulator 60. The clock signal 64 may be derived from an early stage of the counter 44 and is selected to be significantly more frequent than the interval between synchronizing message 52.

Referring now to FIGS. 3 and 4, upon each clock signal 64, the accumulator adds a value equal to the addend 58 to increase its output 62 (if the addend is positive) or to decrease its output (if the addend is negative). If the addend is positive, as shown by graph line 70 and the addend 58 has a value shown by addend 58a, then after eight pulses of clock signal 64, the accumulator 60 will potentially overflow at time 72. This potential overflow causes a subtraction from the accumulator 60 of full scale value 59a and produces a potential overflow signal on the subtract pulse line 42 to the pulse modification circuitry 38 to cause a pulse suppression effectively lowering the frequency output by the divide-by-N counter by amount $\epsilon$. This lowering of frequency occurs once per each period a. Period a is therefore a function of the size of addend 58a.

Alternatively, a greater error value 58b, will provide, as indicated by graph line 74, a potential overflow every four pulses of clock signal 64, and thus a repetition overflows at period b smaller than period a.

Typically, a much larger number of clock periods will be required for the overflow, however, the number of clock periods in FIG. 4 has been reduced for clarity.

Conversely, if the addend 58 is negative as indicated by addend 58c, then according to graph line 76, a periodic potential underflow will occur. A potential underflow causes an addition to the accumulator 60 of full scale value 59c and produces an underflow signal on add pulse line 40 to add a pulse via the pulse modification circuitry 38, thus momentarily increasing the frequency driving the counter 44 by amount $\epsilon$.

It thus will be understood that the error signal 54 affects an increase or decrease of the frequency driving the counter 44. Because the increase and decrease are affected by pulse adding or pulse suppression of a single pulse, there is no discontinuity in the count produced in the counter 44. Although the pulse adding and pulse subtraction provide only discrete corrections of the frequency from divide-by-N counter 39, the rate at which these corrections is performed allows essentially continuous variation of the average frequency over a relatively short window period.

Figure 5:
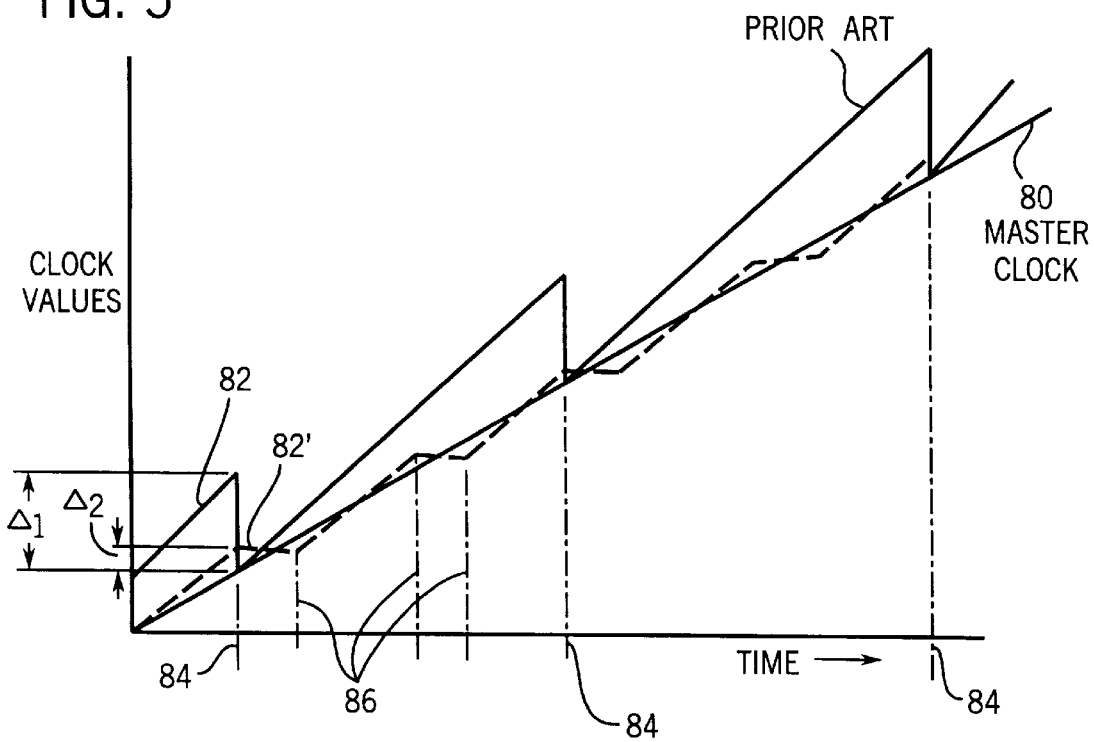
FIG. 5 is a graph of an apparent time provided by the clock circuit versus actual time provided by the master clock showing operation of the present invention in reducing the deviation from the master time.

Referring now to FIG. 5, an external master time clock produces a steadily increasing master clock value 80 subject only to the quantification of the particular counter providing the time value to the various controllers 12. A local clock value 82 produced by a separate oscillator will have an unavoidable deviation from the oscillator of master clock value 80. Such a difference in time value results from manufacturing differences in the oscillating crystal or other similar systematic effects.

The deviation between the time provided by the master clock value 80 and the local clock value 82 in the prior art was corrected at update intervals 84. The clocks of the prior art could deviate in absolute time by an amount $\Delta_1$ just before the update interval 84.

In the present invention, effective intervening update intervals 86 occur upon each overflow of the accumulator 60. Thus, although the effective oscillator 34 of the local clock has the same deviation as before, shown by local clock value 82', the more frequent occurrence of the update intervals 86 causes the maximum deviation in time value $\Delta_2$ to be much smaller than $\Delta_1$. Note generally that the update intervals 86 need not and do not correspond or align with the update intervals 84, and that the slope of the local clock value 82' at times of correction represent an average frequency affected by the insertion or deletion of pulse by the divide-by-N counter 39.

Because the deviation between the master clock value 80 and the local clock value 82' is not limited to simple differences in oscillator speeds but may also include the effect of oscillator drift and other effects, $\Delta_1$ may in fact be greater than shown and $\Delta_2$ may effect a more substantial improvement by correcting for frequency drift and these other higher order effects via more sophisticated calculations of error signal 54 described above. Thus, the present invention may to some extent anticipate errors as well as distribute the corrections over more frequent updating intervals.

The above description has been that of a preferred embodiment of the present invention, it will occur to those that practice the art that many modifications may be made without departing from the spirit and scope of the invention. In order to apprise the public of the various embodiments that may fall within the scope of the invention, the following claims are made.

I claim:

1. A local clock for an industrial controller synchronizable to a remote master clock, the local clock comprising:

(a) an oscillator providing a set of discrete frequencies;

(b) a counter communicating with the oscillator to produce a first time value;

(c) an input periodically receiving an error signal at a first rate, the error signal indicating deviation of the first time value of the local clock from a second time value of the master clock; and (d) a correction circuit responsive to the error signal to switch the oscillator between multiple discrete frequencies at a second rate greater than the first rate so as to reduce the maximum deviation between the first time value and the second time value.

2. The local clock of claim 1 wherein the oscillator includes a constant frequency time base providing an output to a divide-by-N counter also receiving a divisor input from the correction circuit wherein a change among the set of discrete frequencies is provided by changing the divisor.

3. The local clock of claim 1 wherein the correction circuit includes an accumulator adding periodically at the second rate an addend related to the error signal, the accumulator providing a potential overflow and underflow output communicated with the oscillator to temporarily switch the oscillator between ones of the multiple discrete frequencies at the second rate determined by the potential overflow and underflow.

4. The local clock of claim 3 wherein the accumulator upon the occurrence of a potential underflow or potential overflow is adjusted by a full scale value of the accumulator so as to always contain an in-range accumulation value.

5. The local clock of claim 3 wherein the multiple frequencies are adjacent discrete frequencies and whereby frequencies between the adjacent frequencies may be simulated by varying the value of the addend.

6. The local clock of claim 1 wherein the master clock includes an oscillator and a counter for providing the second time value and wherein the error signal is related to at least one of the group consisting of: frequency deviation between the oscillator of the local clock and the oscillator of the master clock, time deviation between first time value of the local clock and the second time value of the master clock and, and drift in frequency deviation between the oscillator of the local clock and the oscillator of the master clock.

7. The local clock of claim 1 including further at least one snapshot register having a reference signal trigger and communicating with the counter to receive the first time value and storing the time value when the reference signal trigger is activated.

8. The local clock of claim 7 wherein the reference signal trigger is activated at the first rate and wherein the snapshot register is used to create the error value.

\* \* \* \* \*